United States Patent
Jeong (10) Patent No.: US 6,654,294 B2
(45) Date of Patent: Nov. 25, 2003

(54) FLASH MEMORY DEVICE (75) Inventor: Weon Hwa Jeong, Seoul (KR)

(73) Assignee: Hynix Semiconductor Inc., Kyungki-do (KR)

(*) Notice: Subject to any disclaimer, the term of this patent is extended or adjusted under 35 U.S.C. 154(b) by 169 days.

(21) Appl. No.: 10/006,893

(22) Filed: Dec. 10, 2001

(65) Prior Publication Data
US 2003/0002337 A1 Jan. 2, 2003

(30) Foreign Application Priority Data
Jun. 29, 2001 (KR) ........................... 2001-38390

(51) Int. Cl.[7] ................................. G11C 7/00
(52) U.S. Cl. ...................... 365/189.09; 365/185.18; 365/185.23
(58) Field of Search ................ 365/189.09, 189.11, 365/185.18, 185.23

(56) References Cited

U.S. PATENT DOCUMENTS 5,815,440 A * 9/1998 Akaogi et al. ......... 365/185.24
5,898,616 A * 4/1999 Ono ...................... 365/185.17

* cited by examiner

Primary Examiner—Vu A. Le
(74) Attorney, Agent, or Firm—Morgan, Lewis & Bockius LLP (57) ABSTRACT

The present invention relates to a flash memory device. The flash memory device comprises a flash memory cell array; a multiplexer for selecting bit lines of said flash memory cell array; a decoder for selecting word lines of said flash memory cell array depending on global word line signals, a control signal, local word line signals and pre-decoding signals; an internal voltage generator for generating a given internal voltage; and a source control unit for applying the internal voltage from said internal voltage generator to sources of a not-selected flash memory cell depending on the global word line signals, a sector program signal, a sector coding signal and a readout signal. Therefore, the present invention can increase the threshold voltage of a not-selected cell and can compensate for reduction in the threshold voltage of the not-selected cell by a drain coupling depending on a drain voltage supplied to bit lines of a selected cell. Thus, the present invention can reduce the chip size and improve the program speed.

30 Claims, 6 Drawing Sheets

FLASH MEMORY DEVICE

BACKGROUND OF THE INVENTION

1. Field of the Invention

The invention relates generally to a flash memory device. More particularly to, the invention is concerned with a flash memory device capable of reducing the chip size and improving the program speed of a selected cell, by applying a given voltage to a source of a not-selected cell in order to increase the threshold voltage of the not-selected cell during the selected cell is programmed, and compensating for reduction in the threshold voltage of the not-selected cell due to a drain coupling depending on the drain voltage supplied to bit lines of the selected cell

2. Description of the Prior Art

Figure 1A:
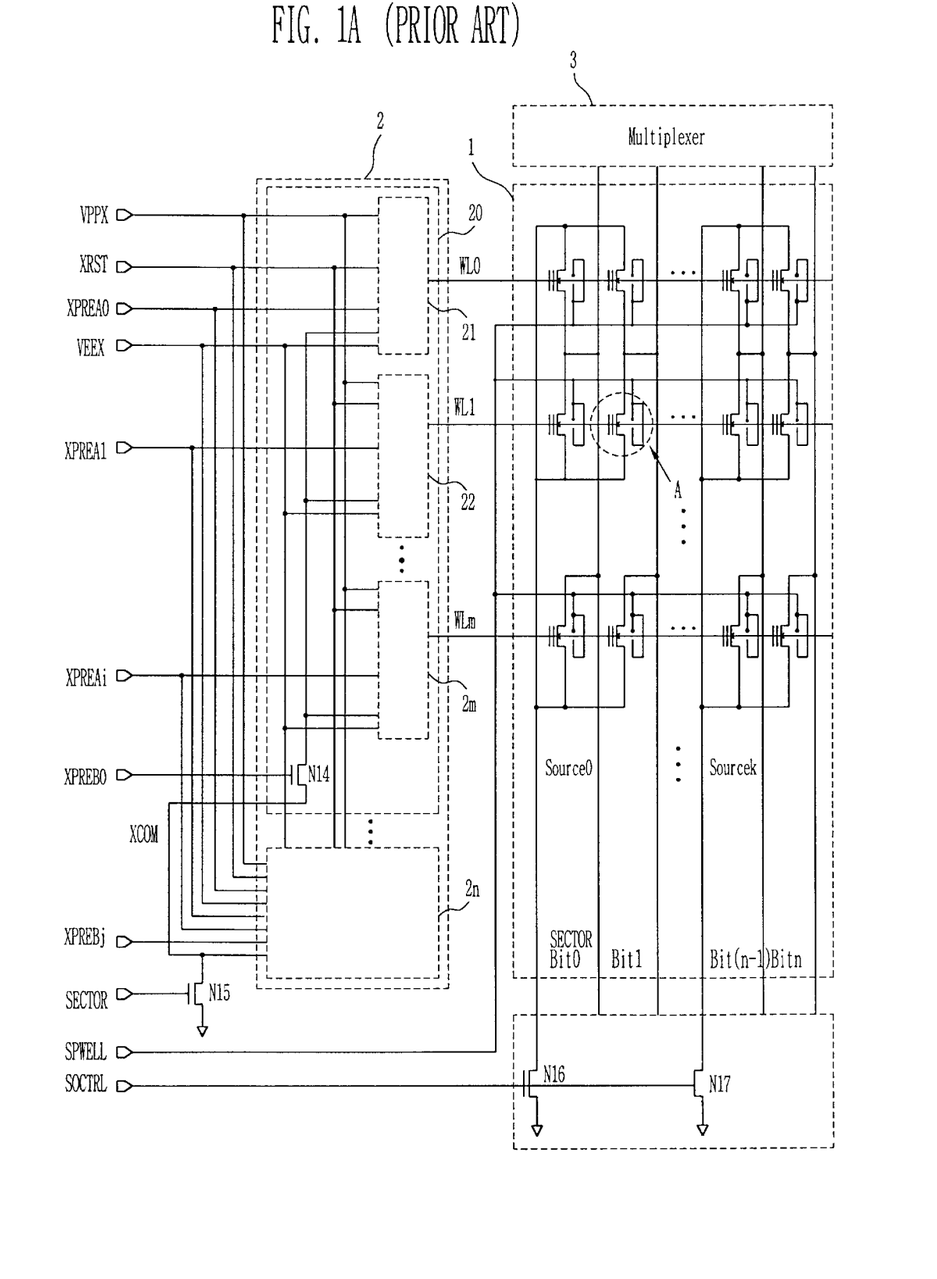
FIG. 1A and FIG. 1B are circuit diagrams of a conventional flash memory device.

A conventional flash memory device includes a NOR-type flash memory cell array 1, a decoder unit 2 for controlling the word lines of the cell, and a multiplexer 3 for controlling the bit lines and the source lines of the cell, as shown in FIG. 1A.

Figure 1B:
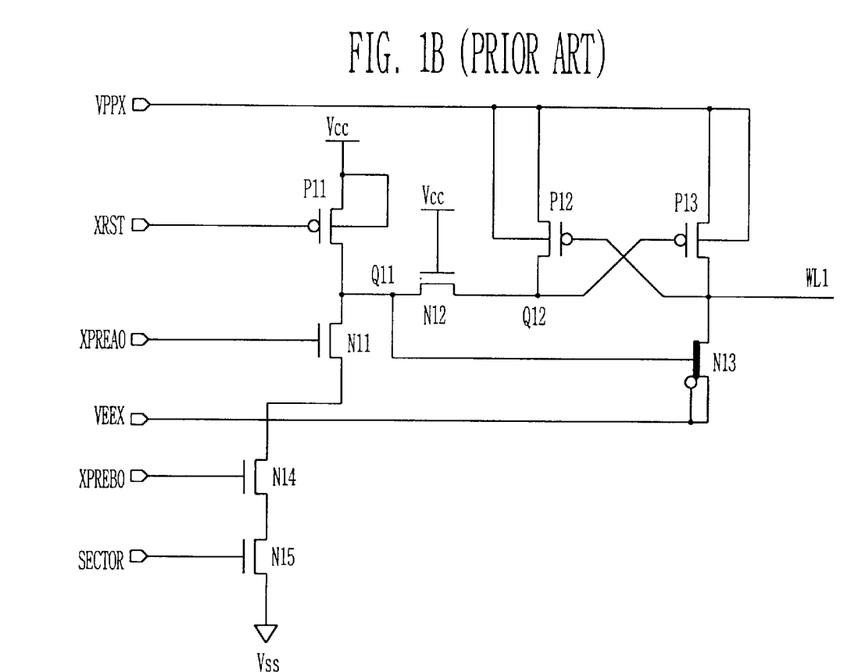

The decoder unit 2 consists of a plurality of unit circuit units 21 through 2n depending on inputted pre-decoding signals XPREA and XPREB, which is shown in FIG. 1B. Each of the unit circuit elements is supplied with a first supply power voltage VPPX being a positive high voltage, a reset signal XRST, and a second supply power voltage VEEX being a negative high voltage. For convenience, the construction of the decoder unit in FIG. 1A is substituted with a circuit construction for receiving the first pre-decoding signal XPREA1 as an input.

A first PMOS transistor P11 driven by the reset signal XRST is connected between the third power supply terminal Vcc and the first node Q11. A first NMOS transistor N11 driven by the first pre-decoding signals XPREA0, a fourth NMOS transistor N14 driven by the second pre-decoding signals XPREB0 and a fifth NMOS transistor N15 driven by a sector signal SECTOR is serially between the first node Q11 and a ground terminal Vss. A second PMOS transistor P12 driven by the potential of the second word line WL1 is connected between the first power supply terminal VPPX and the second node Q12. A third PMOS transistor P13 driven by the potential of the second node Q12 is connected between first power supply terminal VPPX and the second word line WL1. A second NMOS transistor N12 driven by the third power supply terminal Vcc is connected between the first node Q11 and the second node Q12. A third NMOS transistor N13 being a triple NMOS transistor, that is driven by the potential of the first node Q11, is connected between the second word line WL1 and the second power supply terminal VEEX.

Meanwhile, the multiplexer 3 is divided into a portion for controlling bit lines and a portion for controlling source lines of each of the cells. The multiplexer 3 for controlling the source lines includes a NMOS transistor connected between the source line and the ground terminal Vss. Each of the NMOS transistors is driven by a source control signal SOCTRL.

Figure 2:
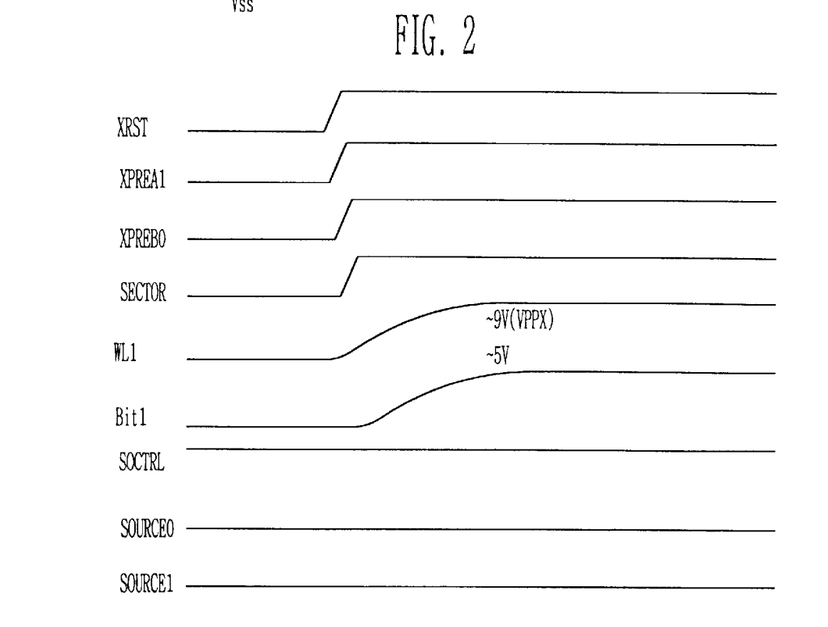
FIG. 2 is an operating timing chart of the flash memory device in FIG. 1.

A method of programming a conventional flash memory device mentioned above will be now described by reference to the operating timing chart in FIG. 2.

If a program command, a program address and a program data are inputted, the reset signal XRST is transited from a LOW state to a HIGH state. On the other hand, the first pre-decoding signal XPREA1, the second pre-decoding signals XPREB0 and the sector signal SECTOR, which are selected by the program address, are transited from a LOW state to a HIGH state. Therefore, the first PMOS transistor P11 is turned off by the reset signal XRST of a HIGH state. Also, the fourth and fifth NMOS transistor N14 and N15 are turned on by the second pre-decoding signals XPREB0 and the sector signal SECTOR being a HIGH state. Due to this, the potential of the first node Q11 is maintained to be a LOW state. The third NMOS transistor N13 is turned off by the potential of the first node Q11 being a LOW state. Meanwhile, as the second node Q12 is connected through the first node Q11 and the second NMOS transistor N12, they are transited to a LOW state. The third PMOS transistor P13 is turned off by the potential of the second node Q12 being a LOW state. Therefore, the first supply power voltage VPPX is supplied to the second word line WL1. As the potential of the second word line WL1 is kept at a high voltage, the second PMOS transistor P12 is turned off. The first supply power voltage VPPX supplied to the second word line WL1 by means of a gate pump is raised to a program voltage (about 9V). At the same time, the bit line selected by the program address is raised from a LOW state to a program voltage by means of the drain pump, so that the program operation for the selected cell A can proceed. At this time, the source lines in all the cells are maintained at a ground potential Vss since the sixth and seventh NMOS transistors N16 and N17 are turned on by the source control signal SOCTRL being a HIGH state.

However, in the conventional flash memory device performing the above program operation, the drain voltage in the cell is increased to 5V being the program voltage, so that the threshold voltage for a not-selected cell is lowered by a coupling. Due to this, the leakage current of the not-selected cell is increased. Therefore, the program current for the selected cell requires about twice of a pure program current of a cell to significantly increase the size of the drain pump for supplying the current to the bit lines in the cell. Also, there is a problem that the drain voltage in an actually selected cell is significantly lowered to degrade the program speed of the cell since the bit line current of the selected cell is increased.

SUMMARY OF THE INVENTION

It is therefore an object of the present invention to provide flash memory device capable of reducing the cell current and improving the program speed when a program operation is performed, by controlling the source voltage of the flash memory cell.

In order to accomplish the above object, a flash memory device according to a first embodiment of the present invention is characterized in that it comprises a flash memory cell array; a multiplexer for selecting bit lines of said flash memory cell array; a decoder for selecting word lines of said flash memory cell array depending on the global word line signals, a control signal, local word line signals and pre-decoding signals; an internal voltage generator for generating a given internal voltage; and a source control unit for applying the internal voltage from said internal voltage generator to sources of a not-selected flash memory cell depending on the global word line signals, a sector program signal, a sector coding signal and a readout signal.

Also, a flash memory device according to a second embodiment of the present invention is characterized in that it comprises a flash memory cell array; a multiplexer for selecting bit lines of said flash memory cell array; a decoder for selecting word lines of said flash memory cell array depending on global word line signals a control signal, local word line signals and pre-decoding signals; an internal voltage generator for generating a given internal voltage; and a source control unit for applying an internal voltage from said internal voltage generator to sources of a not-selected flash memory cell depending on a sector program signal and the potential of said word lines.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings, in which like reference numerals are used to identify the same or similar parts.

Figure 3:
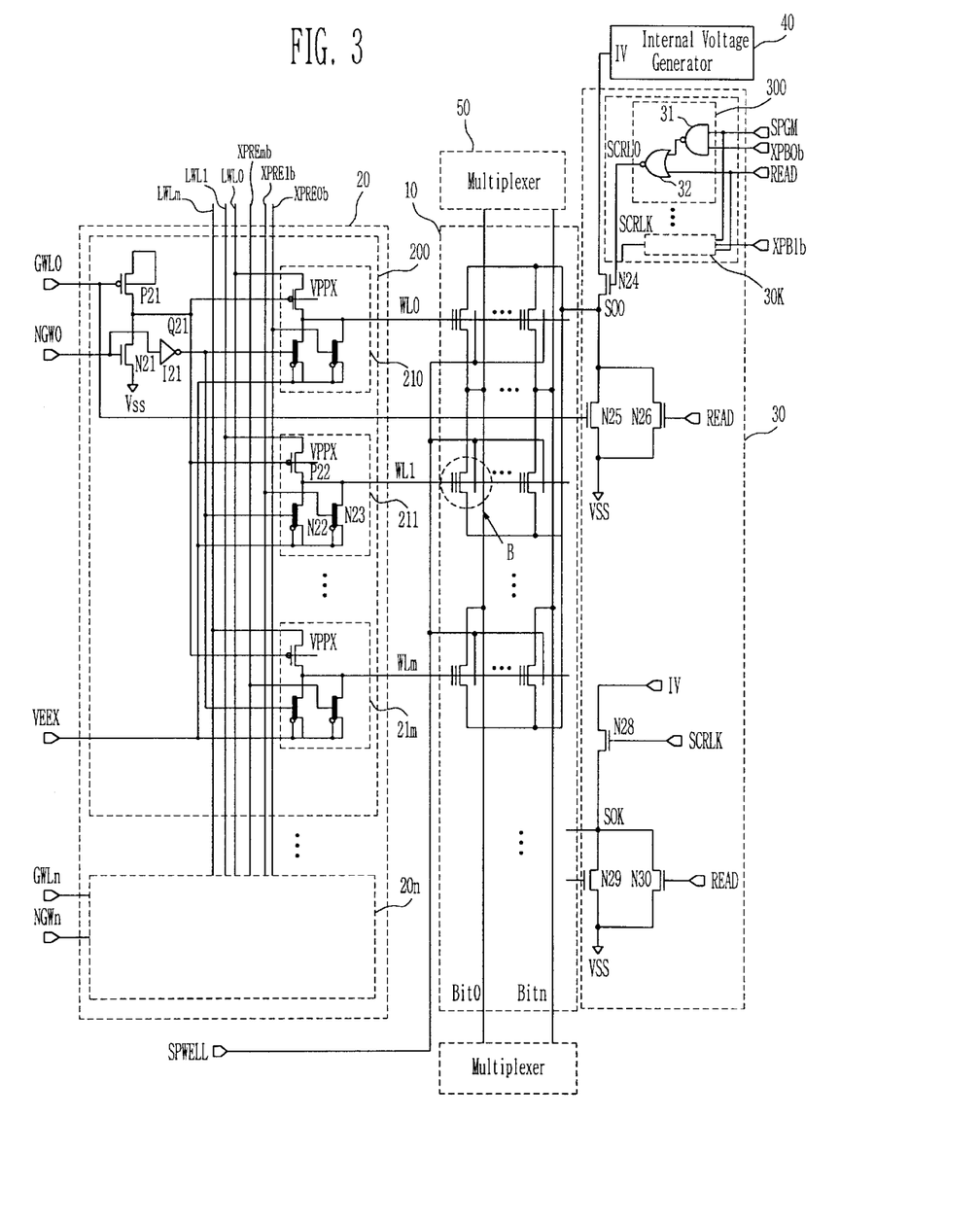
FIG. 3 is a circuit diagram of a flash memory device according to a first embodiment of the present invention.

FIG. 3 is a circuit diagram of a flash memory device according to a first embodiment of the present invention. The flash memory device includes a NOR-type flash memory cell array 10, a decoder unit 20 for controlling word lines of the memory cell, a source control unit 30 for controlling source lines of the memory cell, an internal voltage generator 40 for generating a given internal voltage, and a multiplexer 50 for controlling bit lines of the cell.

The decoder unit 20 consists of a plurality of decoding blocks 200 through 20n driven by a plurality of global word line signals GWL0 through GWLn. Also, a single decoding block consists of a plurality of decoding circuit units 210 through 21m driven by local word line signals LWL0 through LWLm.

A construction of the second decoder circuit unit 211 driven by the first global word line signal GWL0 and the second local word line signal LWL1 will be now explained as an example. A first PMOS transistor P21 driven by the first global word line signal GWL0 is connected to the first node Q21 so that the voltage of the source terminal and the well can be raised by a boosting voltage. A first NMOS transistor N21 connected between the first node Q21 and the ground terminal Vss is driven by the first control signal NGW0. A first inverter I21 inverts the first control signal NGW0. A second PMOS transistor P22 connected between an input terminal of the second local word line signal LWL1 and the second word line WL1 is driven b the potential of the first node Q21. A second NMOS transistor N22 connected between the second word line WL1 and the second power supply terminal VEEX is driven by the output signal of the first inverter I21. A third NMOS transistor N23 connected between the second word line WL1 and the second power supply terminal VEEX is driven by a second pre-decoder bar signal XPRE1b. At this time, the second and third NMOS transistors N22 and N23 are each a triple well NMOS transistor.

Meanwhile, a well bias SPWELL is applied to the wells of each of the flash memory cells constituting the flash memory cell array 10.

The source control unit 30 is to apply an internal voltage of about 1V generated in the internal voltage generator 40 to a source of the not-selected cell. The source control unit 30 includes a plurality of source control signal generating circuits 300 through 30k. The source control signal generating circuits 300 through 30k may be formed in multiple depending on the number of a common source line of the flash memory cell array 10.

A construction of the first source control signal generating circuit 300 will be now described as an example. A NAND gate 31 logically combines a sector program signal SPGM and a first sector coding bar signal XPB0b. A NOR gate 32 logically combines an output signal of the NAND gate 31 and a readout signal READ. The output signal of this NOR gate 32 becomes a first source control signal SCRL0. Further, the fourth NMOS transistor N24 is connected between the internal voltage generator 40 and the first common source line SO0. The fourth NMOS transistor N24 supplies an internal voltage generated in the internal voltage generator 40 to the first common source line SO0 of the flash memory cell array 10, depending on the first source control signal SCRL0 outputted from the first source control signal generating circuit 300. A fifth NMOS transistor N25 driven by the first global word line signal GWL0 and a sixth NMOS transistor N26 driven by the readout signal READ are in parallel connected between the first common source line SO0 and the ground terminal Vss to control the potential of the first common source line SOURCE0.

Figure 4:
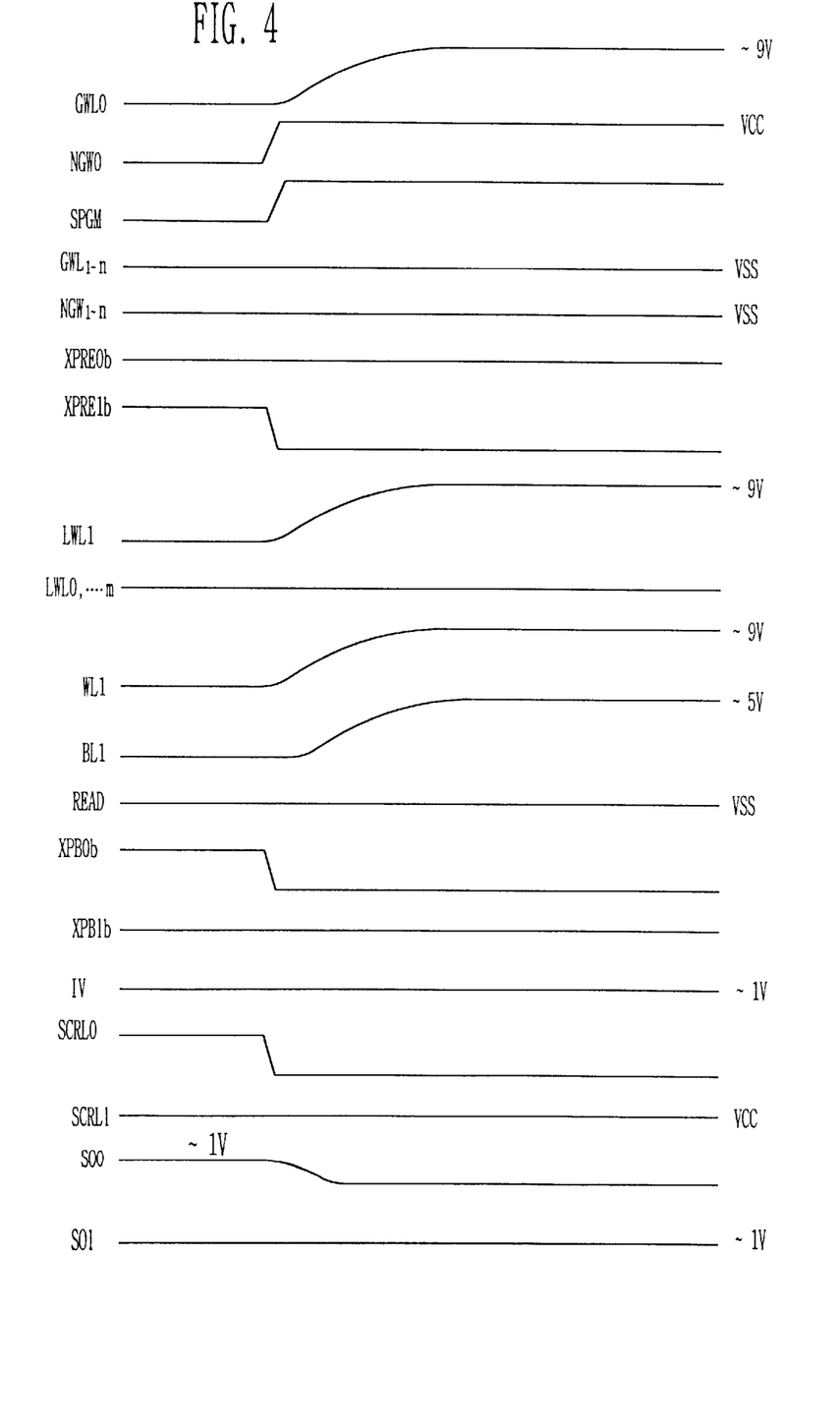
FIG. 4 is an operating timing chart of the flash memory device in FIG. 3.

A program method of the flash memory device according to the first embodiment of the present invention constructed as mentioned above will be now described by reference to the timing chart in FIG. 4. For reference, FIG. 4 is the timing chart in case that the second word line WL1 selected via the second decoding circuit unit 211 is programmed.

In order for the second word line WL1 to be selected via the second decoding circuit unit 211 and a cell thereto to be programmed, the first global word line signal GWL0 and the second local word line signal LWL1 are selected depending on the program address signal and the sector program signal SPGM for the selected sector is also selected. In addition, a second pre-decoder bar signal XPREb for the selected second local word line signal LWL1 is selected. In other words, in order for the second word line WL1 to be selected via the second decoding block 211 and a cell thereto to be programmed, the first global word line signal GWL0 and the second local word line signal LWL1 are supplied with a high voltage of about 9V, and the first control signal NGW0 and the sector program signal SPGM are inputted with a HIGH state.

The first PMOS transistor P21 is turned off by the first global word line GWL0 inputted with a HIGH state and the first NMOS transistor N21 is turned on by the first control signal NGW0 inputted with a HIGH state, so that the first node Q21 can be maintained at a LOW state. Meanwhile, the first control signal NGW0 inputted with a HIGH state is inverted into to a LOW state by the first inverter I21. The second PMOS transistor P22 is turned on by the potential first node Q21 being a LOW state. Further, the second NMOS transistor N22 is turned off by the output signal of the first inverter I21 being a LOW state. The third NMOS transistor N23 is turned off by the second pre-decoder bar signal XPREb being a LOW state. Therefore, a high voltage of the second local word line signal LWL1 is supplied to the second word line WL1. Meanwhile, a memory cell is selected B by a signal from the multiplexer 50 and is then programmed. Also, the first NAND gate 31 logically combines the program signal SPGM of a HIGH state and the first sector coding bar signal XPB0b of a LOW state to produce a signal of a HIGH state. The first NOR gate 32 logically combines the output signal of the first NAND gate 31 being a HIGH state and the readout signal READ of a LOW state to output a first source control signal SCRL0 of a LOW state. The fourth NMOS transistor N24 is turned off by the first source control signal SCRL0 of a LOW state. Therefore, as the internal voltage of about 1V generated in the internal voltage generator 40 is not inputted to the first source line SO0, an internal voltage is not applied to the source of the programmed memory cell. In addition, the fifth NMOS transistor N25 is turned on by the first global word line signal GWL0 of a HIGH state and the sixth NMOS transistor N26 is turned off by the readout signal READ of a LOW state. Thus, the potential of the first source line SO0 is maintained at a ground potential Vss through the turned-on fifth NMOS transistor N25.

Meanwhile, an internal voltage of about 1V that is generated in the internal voltage generator 40 is applied to the source lines other than the first source line SO0. A k source line SOk will be explained as an example. The sector program signal SPGM of a HIGH state and the first sector coding bar signal XPM1b of a HIGH state are inputted to the first NAND gate (not shown), and the first NAND gate (not shown) logically combines those signals to output a signal of a LOW state. The output signal of the first NAND gate (not shown) being a LOW state and the readout signal READ being a LOW state are inputted into the first NOR gate (not shown), and the first NOR gate (not shown) logically combines those signals to output a k source control signal SCRLk of a HIGH state. A seventh NMOS transistor N27 is turned on by the k source control signal SCRLk of a HIGH state, so that an internal voltage of about 1V that is generated in the internal voltage generator 40 is applied to the first source line SOl. Meanwhile, as the n-th global word line signal GWLn is applied with a LOW state and the readout signal READ is applied with a LOW state, eighth and ninth NMOS transistors N28 and N29 are turned off.

As such, the threshold voltage of the cell can be increased by about 0.5V by applying the internal voltage of about 1V, that does not give a stress to the source terminal, to the source line of the not-selected memory cell. Therefore, reduction in the threshold voltage the not-selected cell by the drain coupling depending on the drain voltage supplied to the bit lines of the selected cell can be compensated for.

Figure 5:
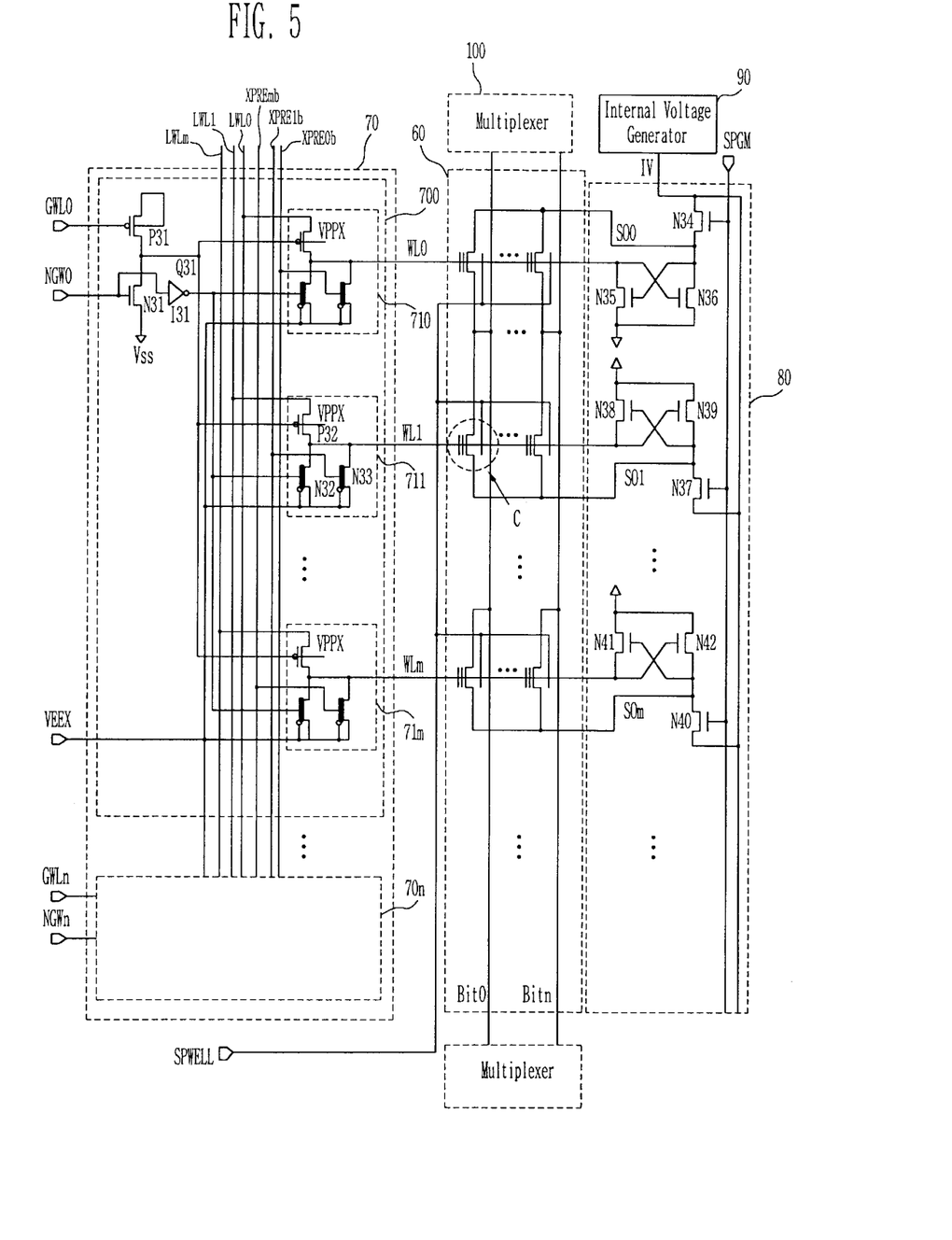
FIG. 5 is a circuit diagram of a flash memory device according to a second embodiment of the present invention.

FIG. 5 is a circuit diagram of a flash memory device according to a second embodiment of the present invention. The flash memory device includes The decoder unit 70 consists of a plurality of decoding blocks 700 through 70n driven by a plurality of global word line signals GWL0 through GWLn. Also, a single decoding block consists of a plurality of decoding circuit units 710 through 71m depending on local word line signals LWL0 through LWLm.

A construction of the second decoder circuit unit 711 driven by the first global word line signal GWL0 and the second local word line signal LWL1 will be now explained as an example. A first PMOS transistor P31 driven by the first global word line signal GWL0 is connected to the first node Q31 so that the voltage of the source terminal and the well can be raised by a boosting voltage. A first NMOS transistor N31 connected between the first node Q31 and the ground terminal Vss is driven by the first control signal NGW0. A first inverter I31 inverts the first control signal NGW0. A second PMOS transistor P32 connected between an input terminal of the second local word line signal LWL1 and the second word line WL1 is driven b the potential of the first node Q31. A second NMOS transistor N32 connected between the second word line WL1 and the second power supply terminal VEEX is driven by the output signal of the first inverter I31. A third NMOS transistor N33 connected between the second word line WL1 and the second power supply terminal VEEX is driven by a second pre-decoder bar signal XPRE1b. At this time, the second and third NMOS transistors N32 and N33 are each a triple well NMOS transistor.

Meanwhile, a well bias SPWELL is applied to the wells of each of the flash memory cells constituting the flash memory cell array 10.

In addition, the source control unit 80 includes a plurality of NMOS transistors N34, N37 and N40 for applying a voltage of about 1V that is generated in the internal voltage generator 90 to a plurality of the common source lines SO0 through SOm, respectively, depending on the sector program signal SPGM, a plurality of NMOS transistors N35, N38 and N41 for controlling the potential of the word lines WL0 through WLm depending on the potentials of the common source lines SO0 through SOm, respectively, and a plurality of NMOS transistors N36, N39 and N42 for controlling the potentials of the common source lines SO0 through SOm depending on the potential of the word lines WL0 through WLm, respectively.

Figure 6:
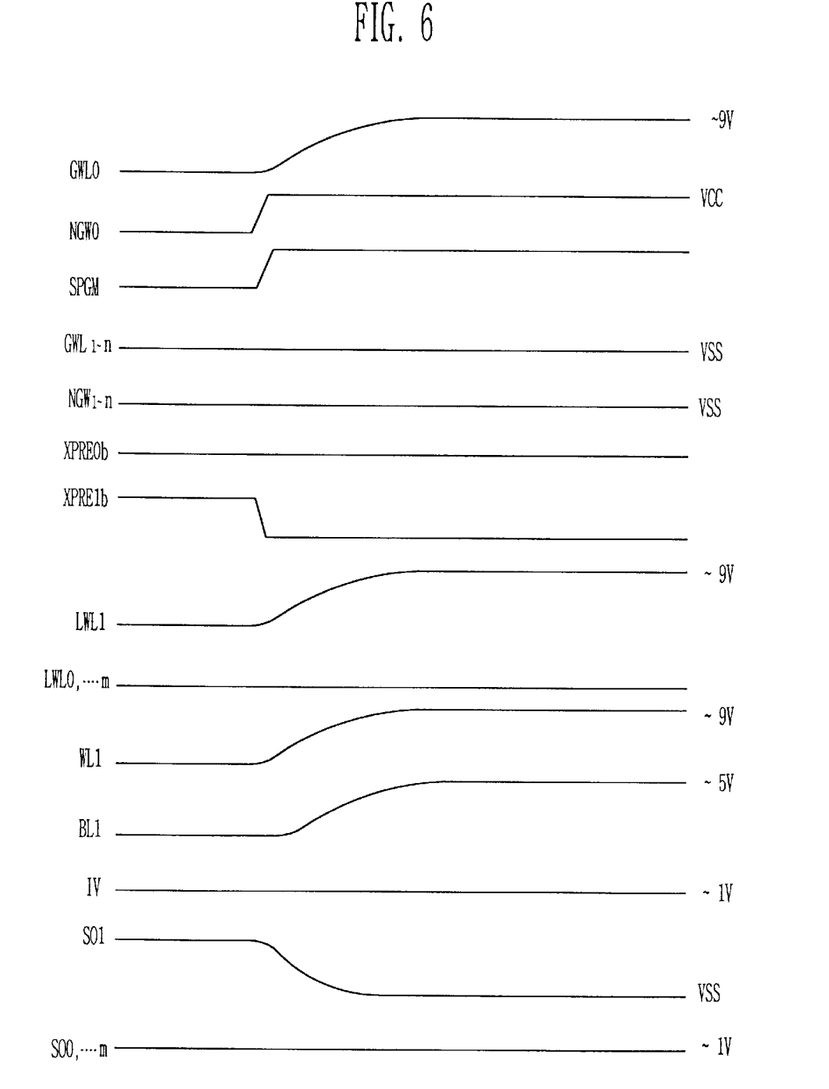
FIG. 6 is an operating timing chart of the flash memory device in FIG. 5.

A program method of the flash memory device according to the second embodiment of the present invention constructed as mentioned above will be now described by reference to the timing chart in FIG. 6. For reference, FIG. 6 illustrates the timing chart in case that the second word line WL1 selected via the second decoding circuit unit 711 is programmed.

In order for the second word line WL1 to be selected via the second decoding circuit unit 711 and a cell thereto to be programmed, the first global word line signal GWL0 and the second local word line signal LWL1 are selected depending on the program address signal and the sector program signal SPGM for the selected sector is also selected. In addition, a second pre-decoder bar signal XPREb for the selected second local word line signal LWL1 is selected. In other words, in order for the second word line WL1 to be selected via the second decoding block 711 and a cell thereto to be programmed, the first global word line signal GWL0 and the second local word line signal LWL1 are supplied with a high voltage of about 9V, and the first control signal NGW0 and the sector program signal SPGM are inputted with a HIGH state.

The first PMOS transistor P31 is turned off by the first global word line GWL0 inputted with a HIGH state and the first NMOS transistor N31 is turned on by the first control signal NGW0 inputted with a HIGH state, so that the first node Q31 can be maintained at a LOW state. Meanwhile, the first control signal NGW0 inputted with a HIGH state is inverted into to a LOW state by the first inverter I31. The second PMOS transistor P32 is turned on by the potential first node Q31 being a LOW state. Further, the second NMOS transistor N32 is turned off by the output signal of the first inverter I31 being a LOW state. The third NMOS transistor N33 is turned off by the second pre-decoder bar signal XPREb being a LOW state. Therefore, a high voltage of the second local word line signal LWL1 is supplied to the second word line WL1. Meanwhile, a memory cell is selected C by a signal from the multiplexer 100 and is then programmed.

In addition, fourth, seventh and tenth NMOS transistors N34, N37 and N40 are turned on by the sector program signal SPGM of a HIGH state, so that an internal voltage generated in the internal voltage generator 90 is applied to common source lines SO0 through SOm, respectively. However, a ninth NMOS transistor N39 is turned on by the second word line WL1 of a HIGH state. Due to this, the internal voltage supplied to the second the common source line SO1 is transferred to the ground terminal Vss, so that the second the common source line SO1 is kept at a LOW state. Further, the eighth NMOS transistor N38 is turned off by the potential of the second common source line SO1 being a LOW state. Therefore, the internal voltage is not applied to the source of the memory cell block in which the selected memory cell C is included. On the other hand, word lines other than the second word line WL1 is kept at a LOW state. By taking an the shown first and m-th word line WL1 as an example, they are maintained at a LOW state, so that the sixth and twelfth NMOS transistors N36 and N42 are turned off. Thereby, an internal voltage is applied to the first and m-th the common source lines SO0 and SOm. Also, the fifth and eleventh NMOS transistors N35 and N41 are turned on by the potential of the first and m-th the common source lines SO0 and SOm being a HIGH state, so that the potential of the first and m-th word lines WL0 and WLm are reduced to the ground potential Vss. Therefore, an internal voltage is applied to the sources of the memory cell block other than the memory cell blocks in which the selected memory cell C is included.

As can be understood from the above description, according to the present invention, the threshold voltage of the not-selected cell can be increased, by applying the voltage of about 1V to the source of the not-selected cell during the time when the selected cell is programmed. Also, reduction in the threshold voltage of the not-selected cell by the drain coupling depending on the drain voltage supplied to the bit lines of the selected cell can be compensated for. Therefore, as the bit line current of the selected cell becomes almost same to the program current value of the selected cell, the size of the drain pump can be smaller than a conventional pump size. Thus, there is an outstand effect that the size of the chip can be reduced. Further, there is an effect that fall in the bit lines of the selected cell can be reduced to improve the program speed of the selected cell since the bit line current of the selected cell is reduced.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed are:

1. A flash memory device, comprising:
   a flash memory cell array;
   a multiplexer for selecting bit lines of the flash memory cell array;
   a decoder for selecting word lines of the flash memory cell array depending on global word line signals, a control signal, local word line signals, and pre-decoding signals;
   an internal voltage generator for generating an internal voltage; and
   a source control unit for applying the internal voltage from the internal voltage generator to sources of an unselected flash memory cell depending on the global word line signals, a sector program signal, a sector coding signal and a readout signal.

2. The device according to claim 1, wherein the decoder includes a plurality of decoding blocks driven by the global word line signals, and wherein the decoding blocks include a plurality of decoding circuit units driven by the local word line signals.

3. The device according to claim 2, wherein the decoding blocks include:
   first and second switching means for controlling a potential of a first node depending on the global word line signals and the control signal;
   an inverting means for inverting the control signal; and
   a plurality of decoding circuits for selecting the word lines of the flash memory cell array selected by the local word line signals and the pre-decoding signals depending on the potential of the first node.

4. The device according to claim 3, wherein the first switching means includes a PMOS transistor driven by the global word line signals.

5. The device according to claim 3, wherein the second switching means includes a NMOS transistor, driven by the control signal, connected between the first node and a ground terminal.

6. The device according to claim 3, wherein the plurality of decoding circuits include:
   a first switching means for supplying the local word line signals to the word line depending on the potential of the first node;
   a second switching means for controlling a potential of the word lines depending on an output signal of the inverting means; and
   a third switching means for controlling the potential of the word lines depending on the pre-decoding signals.

7. The device according to claim 6, wherein the first switching means includes a PMOS transistor, driven by the potential of the first node, connected between an input terminal of the local word line signals and the word line.

8. The device according to claim 6, wherein the second switching means includes a triple NMOS transistor, driven by the output signal of the inverting means, connected between the word line and a negative high voltage input terminal.

9. The device according to claim 6, wherein the third switching means includes a triple NMOS transistor, driven by the pre-decoding signals, connected between the word line and a negative high voltage input terminal.

10. The device according to claim 1, wherein the source control unit includes a plurality of source control means dependent upon the sector coding signal.

11. The device according to claim 10, wherein the plurality of source control means include:
    a first logic means for logically combining the sector program signal and the sector coding signal;
    a second logic means for logically combining an output signal of the first logic means and the readout signal;

a first switching means for supplying the internal voltage generated in the internal voltage generator to a source of the flash memory cell array depending an output signal of the second logic means;

a second switching means for controlling a potential of a source terminal depending on the global word line signals; and a third switching means for controlling the potential of the source terminal depending on the readout signal.

12. The device according to claim 11, wherein the first logic means includes a NAND gate.

13. The device according to claim 11, wherein the second logic means includes a NOR gate.

14. The device according to claim 11, wherein the first switching means includes a NMOS transistor connected between the internal voltage generator and the source terminal of the flash memory cell array.

15. The device according to claim 11, wherein the second switching means includes a NMOS transistor, driven by the global word line signals, connected between the source terminal of the flash memory cell array and a ground terminal.

16. The device according to claim 11, wherein the third switching means includes a NMOS transistor, driven by the readout signal, connected between the source terminal of the flash memory cell array and a ground terminal.

17. A flash memory device, comprising:

a flash memory cell array;

a multiplexer for selecting bit lines of the flash memory cell array;

a decoder for selecting word lines of the flash memory cell array depending on global word line signals, a control signal, local word line signals and pre-decoding signals;

an internal voltage generator for generating an internal voltage; and a source control unit for applying the internal voltage from the internal voltage generator to sources of an unselected flash memory cell depending on a sector program signal and a potential of the word lines.

18. The device according to claim 17, wherein the decoder includes a plurality of decoding blocks driven by the global word line signals, and wherein the decoding blocks include a plurality of decoding circuit units driven by the local word line signals.

19. The device according to claim 18, wherein the plurality of decoding blocks include:

first and second switching means for controlling a potential of a first node dependent upon the global word line signals and the control signal;

an inverting means for inverting the control signal; and a plurality of decoding circuits for selecting the word lines of the flash memory cell array selected by the local word line signals and the pre-decoding signals depending on the potential of the first node.

20. The device according to claim 19, wherein the first switching means includes a PMOS transistor that is driven by the global word line signals.

21. The device according to claim 19, wherein the second switching means includes a NMOS transistor, driven by the control signal, connected between the first node and a ground terminal.

22. The device according to claim 19, wherein the plurality of decoding circuits include:

a first switching means for supplying the local word line signals to the word line depending on the potential of the first node;

a second switching means for controlling the potential of the word lines depending on an output signal of the inverting means; and a third switching means for controlling the potential of the word lines depending on the pre-decoding signals.

23. The device according to claim 22, wherein the first switching means includes a PMOS transistor, driven by the potential of the first node, connected between an input terminal of the local word line signals and the word line.

24. The device according to claim 22, wherein the second switching means includes a triple NMOS transistor, driven by the output signal of the inverting means, connected between the word line and a negative high voltage input terminal.

25. The device according to claim 22, wherein the third switching means includes a triple NMOS transistor, driven by the pre-decoding signals, connected between the word line and a negative high voltage input terminal.

26. The device according to claim 17, wherein the source control unit includes a plurality of source control means dependent upon the sector coding signal.

27. The device according to claim 26, wherein the plurality of source control means include:

a first switching means for supplying the internal voltage from the internal voltage generator to source terminals of the flash memory cell array depending on the sector program signal;

a second switching means for controlling a potential of the source terminals of the flash memory cell array depending on the potential of the word lines; and a third switching means for controlling the potential of the word lines depending on the potential of the source terminals of the flash memory cell array.

28. The device according to claim 27, wherein the first switching means includes a NMOS transistor, driven by the sector program signal, connected between the internal voltage generator and the source terminals of the flash memory cell array.

29. The device according to claim 27, wherein the second switching means includes a NMOS transistor, driven by the potential of the word lines, connected between the source terminals of the flash memory cell array and a ground terminal.

30. The device according to claim 27, wherein the third switching means includes a NMOS transistor, driven by the source terminal of the flash memory cell array, connected between the word lines and a ground terminal.

* * * * *